United States Patent
Inaba

(10) Patent No.: US 10,050,053 B2
(45) Date of Patent: Aug. 14, 2018

(54) CARBON AND FLUORINE CONCENTRATION OF ELECTRODES FOR A SEMICONDUCTOR DEVICE

(71) Applicant: Toshiba Memory Corporation, Minato-ku (JP)

(72) Inventor: Merii Inaba, Kamakura (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 47 days.

(21) Appl. No.: 14/842,951

(22) Filed: Sep. 2, 2015

(65) Prior Publication Data

US 2016/0079256 A1    Mar. 17, 2016

(30) Foreign Application Priority Data

Sep. 15, 2014 (JP) ................... 2014-187150

(51) Int. Cl.
*H01L 27/11582* (2017.01)
*H01L 29/423* (2006.01)
*H01L 29/49* (2006.01)
*H01L 27/1157* (2017.01)

(52) U.S. Cl.
CPC .... *H01L 27/11582* (2013.01); *H01L 27/1157* (2013.01); *H01L 29/4234* (2013.01); *H01L 29/4916* (2013.01)

(58) Field of Classification Search
CPC ......... H01L 27/11514; H01L 27/11551; H01L 27/11578; H01L 27/11582; H01L 27/11556; H01L 27/11521; H01L 27/11524; H01L 27/11568; H01L 27/1158
See application file for complete search history.

(56) References Cited

U.S. PATENT DOCUMENTS

| | | | |
|---|---|---|---|
| 2011/0057249 A1* | 3/2011 | Nakao | ........... H01L 27/11578 257/324 |
| 2013/0023085 A1* | 1/2013 | Pramanik | .......... H01L 27/101 438/104 |
| 2013/0056815 A1 | 3/2013 | Ishiduki et al. | |
| 2013/0059437 A1 | 3/2013 | Kasahara | |

(Continued)

FOREIGN PATENT DOCUMENTS

| | | |
|---|---|---|
| JP | 10-270555 A | 10/1998 |
| JP | 2003-243503 | 8/2003 |

(Continued)

*Primary Examiner* — Davienne Monbleau
*Assistant Examiner* — Leslie Pilar Cruz
(74) *Attorney, Agent, or Firm* — Oblon, McClelland, Maier & Neustadt, L.L.P.

(57) ABSTRACT

According to one embodiment, a semiconductor device includes a substrate and a multilayer body provided on the substrate. The multilayer body has electrode films and insulating films. The electrode films contain silicon, the insulating films contain silicon oxide. Each of the electrode films and each of the insulating films are alternately stacked. A hole is formed in the multilayer body, and the hole vertically extends in the multilayer body. The electrode films include a first electrode film and a second electrode film located below the first electrode film. Carbon concentration of the first electrode film is higher than carbon concentration of the second electrode film.

2 Claims, 11 Drawing Sheets

(56) References Cited

U.S. PATENT DOCUMENTS

2013/0240970 A1* 9/2013 Kondo .................. H01L 29/788
                                                         257/316
2014/0061773 A1* 3/2014 Higuchi ................ H01L 27/105
                                                         257/326

FOREIGN PATENT DOCUMENTS

JP           2011-60991 A    3/2011
JP            2014-7270 A    1/2014

* cited by examiner

CARBON AND FLUORINE CONCENTRATION OF ELECTRODES FOR A SEMICONDUCTOR DEVICE

CROSS-REFERENCE TO RELATED APPLICATIONS

This application is based upon and claims the benefit of priority from the Japanese Patent Application No. 2014-187150, filed on Sep. 15, 2014; the entire contents of which are incorporated herein by reference.

FIELD

Embodiments described herein relate generally to a semiconductor device and a method for manufacturing the same.

BACKGROUND

Recently, there has been proposed a multilayer nonvolatile semiconductor memory device in which memory cells are integrated in three dimensions. Such a memory device can be realized as follows. Insulating films and electrode films are alternately stacked to form a multilayer body. Holes are formed in this multilayer body. A memory film capable of accumulating charge is formed on the inner surface of the hole. A silicon pillar is formed inside the hole. Thus, a memory cell is formed between the silicon pillar and the electrode film.

DETAILED DESCRIPTION

According to one embodiment, a semiconductor device includes a substrate and a multilayer body provided on the substrate. The multilayer body has electrode films and insulating films. The electrode films contain silicon, the insulating films contain silicon oxide. Each of the electrode films and each of the insulating films are alternately stacked. A hole is formed in the multilayer body, and the hole vertically extends in the multilayer body. The electrode films include a first electrode film and a second electrode film located below the first electrode film. Carbon concentration of the first electrode film is higher than carbon concentration of the second electrode film.

According to another embodiment, a method for manufacturing a semiconductor device includes forming a lower multilayer body by alternately performing deposition of silicon and deposition of silicon oxide. The method includes forming an upper multilayer body by alternately performing deposition of silicon with introduction of carbon and deposition of silicon oxide. The method includes forming a hole in the upper multilayer body and in the lower multilayer body by etching.

First Embodiment

First, a first embodiment is described.

Figure 1:
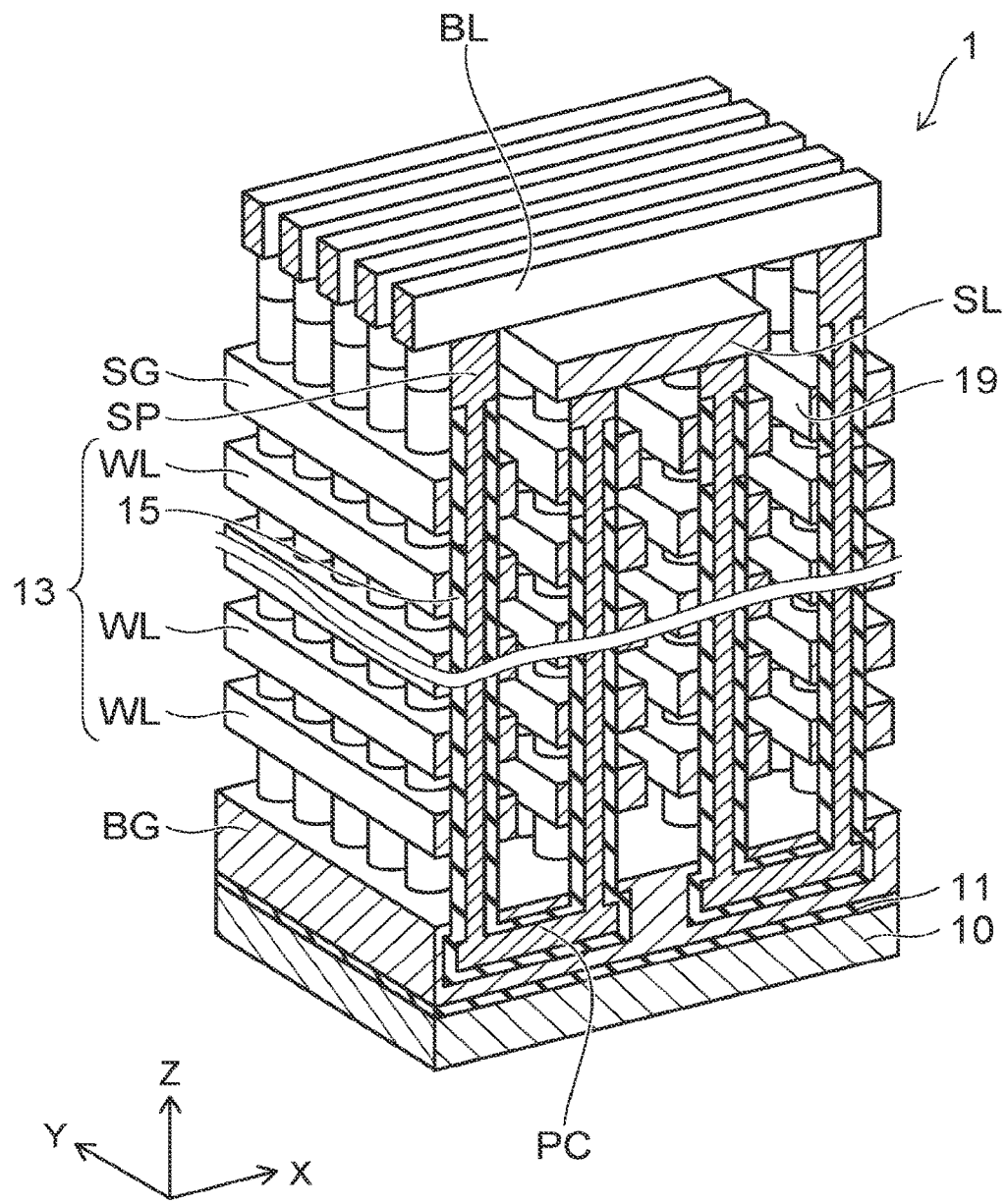
FIG. 1 is a perspective view illustrating a semiconductor device according to a first embodiment.

FIG. 1 is a perspective view illustrating a semiconductor device according to this embodiment.

Figure 2:
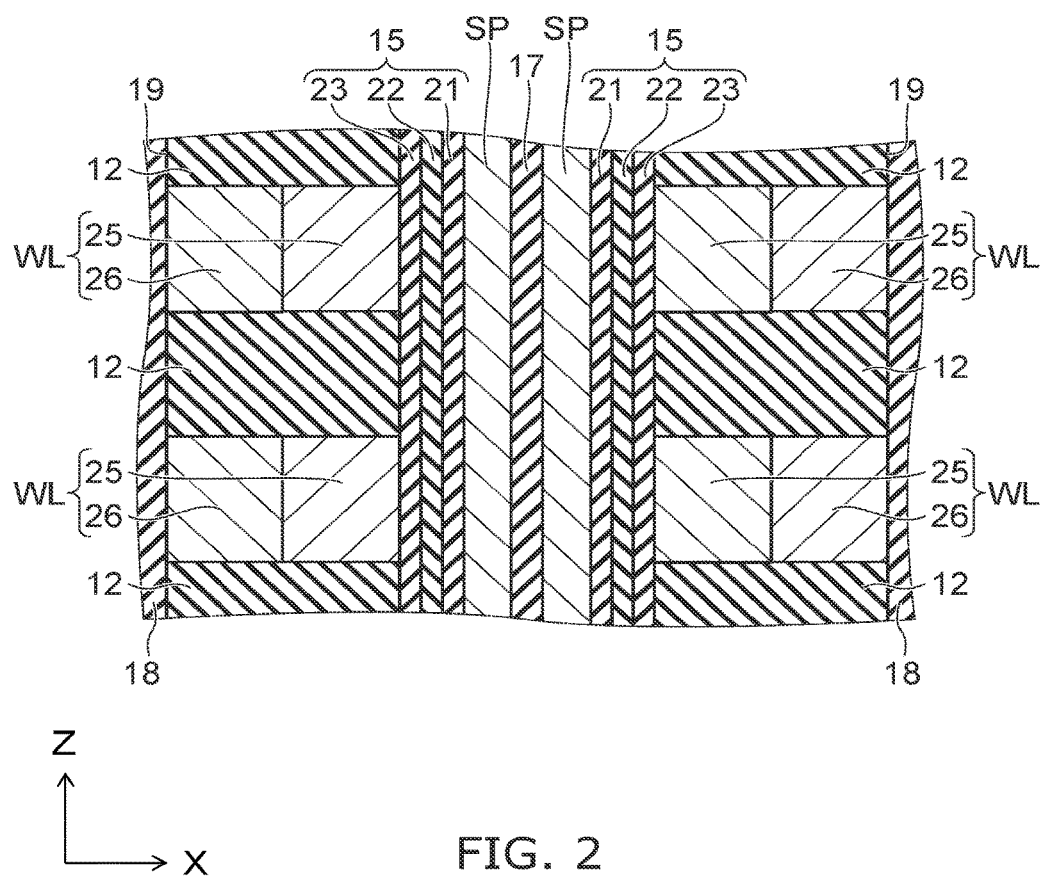
FIG. 2 is a sectional view illustrating the semiconductor device according to the first embodiment.

FIG. 2 is a sectional view illustrating the semiconductor device according to this embodiment.

For convenience of illustration, FIG. 1 primarily shows conductive members, and omits some insulating members. FIG. 2 shows only one silicon pillar and its neighborhood in an enlarged view.

The semiconductor device according to this embodiment is a multilayer nonvolatile semiconductor memory device.

As shown in FIG. 1, the semiconductor device 1 according to this embodiment includes a silicon substrate 10.

In the following, for convenience of description, an XYZ orthogonal coordinate system is adopted in this specification. Two directions parallel to the upper surface of the silicon substrate 10 and orthogonal to each other are referred to as "X-direction" and "Y-direction". The direction perpendicular to the upper surface of the silicon substrate 10, i.e., the vertical direction, is referred to as "Z-direction".

An insulating film 11 and a back gate electrode BG are provided on the silicon substrate 10. The back gate electrode BG is shaped like a flat plate. A pipe connector PC is provided in the back gate electrode BG. The longitudinal direction of the pipe connector PC is directed in the X-direction. The pipe connector PC is shaped like a generally rectangular solid. A plurality of control gate electrode films WL are stacked via interlayer insulating films 12 on the back gate electrode BG and constitute a multilayer body 13. Each control gate electrode film WL is divided into strip-shaped members extending in the Y-direction. That is, in the multilayer body 13, a plurality of control gate electrode films WL each extend in the Y-direction, and are arranged along the X-direction and the Z-direction with spacing from each other.

A select gate electrode SG is provided on the multilayer body 13. The select gate electrode SG is shaped like a strip extending in the Y-direction. Each of the back gate electrode BG, the pipe connector PC, the control gate electrode film WL, and the select gate electrode SG is a conductive film formed from silicon (Si) containing impurity such as boron (B). A source line SL made of e.g. metal and extending in the Y-direction is provided on the select gate electrode SG. A bit line BL made of e.g. metal and extending in the X-direction is provided on the source line SL.

A silicon pillar SP is provided between the back gate electrode BG and the source line SL and between the back gate electrode BG and the bit line BL. The silicon pillar SP extends in the Z-direction through the multilayer body 13 and the select gate electrode SG. The silicon pillar SP connected to the source line SL and the silicon pillar SP connected to the bit line BL are connected to each other through the pipe connector PC. A memory film 15 is provided on the outer surface of a structure composed of the silicon pillar SP and the pipe connector PC. Thus, a memory cell is formed for each crossing portion of the silicon pillar SP and the control gate electrode film WL.

As shown in FIG. 2, the silicon pillar SP and the pipe connector PC are shaped like a pipe. An insulating member 17 made of e.g. silicon oxide is provided inside the silicon pillar SP and the pipe connector PC. In the memory film 15, a tunnel insulating film 21, a charge accumulation film 22, and a block insulating film 23 are stacked sequentially from the silicon pillar SP side. The tunnel insulating film 21 is a film that is normally insulating. However, the tunnel insulating film 21 passes an FN tunnel current under application of a prescribed voltage within the range of the driving voltage of the semiconductor device 1. The charge accumulation film 22 is a film capable of accumulating charge. The charge accumulation film 22 is formed from e.g. a material including electron trap sites. The block insulating film 23 is a film passing substantially no current even under application of voltage within the range of the driving voltage of the semiconductor device 1.

Furthermore, the control gate electrode film WL includes a polysilicon portion 25 located near the silicon pillar SP and a silicide portion 26 located away from the silicon pillar SP. Here, the "polysilicon portion" is a designation that refers to a portion composed primarily of polysilicon. The same also applies to the notation of other portions, layers, films, etc. An insulating member 18 is provided between the control gate electrode films WL and between the interlayer insulating films 12 adjacent in the X-direction. The insulating member 18 is shaped like a plate spreading in the XZ-plane. In other words, the control gate electrode film WL is divided into a plurality of strip-shaped portions pierced by the silicon pillar SP. The central part in the width direction of each strip-shaped portion is formed from polysilicon. Both end parts in the width direction are formed from silicide.

The gate electrode films WL constituting the upper portion of the multilayer body 13, e.g., the control gate electrode films WL constituting 15-25% of the total number of stages from the top, contain carbon (C). Thus, the carbon concentration of the gate electrode films WL constituting the upper portion is higher than the carbon concentration of the gate electrode films WL constituting the portion other than the upper portion. For instance, the carbon concentration of the control gate electrode film WL of the uppermost stage of the multilayer body 13 is higher than the carbon concentration of the control gate electrode film WL of the lowermost stage.

The control gate electrode films WL constituting the lower portion of the multilayer body 13, e.g., the control gate electrode films WL constituting 15-25% of the total number of stages from the bottom, contain fluorine (F). Thus, the fluorine concentration of the control gate electrode films WL constituting the lower portion is higher than the fluorine concentration of the gate electrode films WL constituting the portion other than the lower portion. For instance, the fluorine concentration of the control gate electrode film WL of the lowermost stage of the multilayer body 13 is higher than the fluorine concentration of the control gate electrode film WL of the uppermost stage.

Next, a method for manufacturing a semiconductor device according to this embodiment is described.

FIGS. 3 to 8 are sectional views illustrating a method for manufacturing a semiconductor device according to this embodiment.

Figure 3:
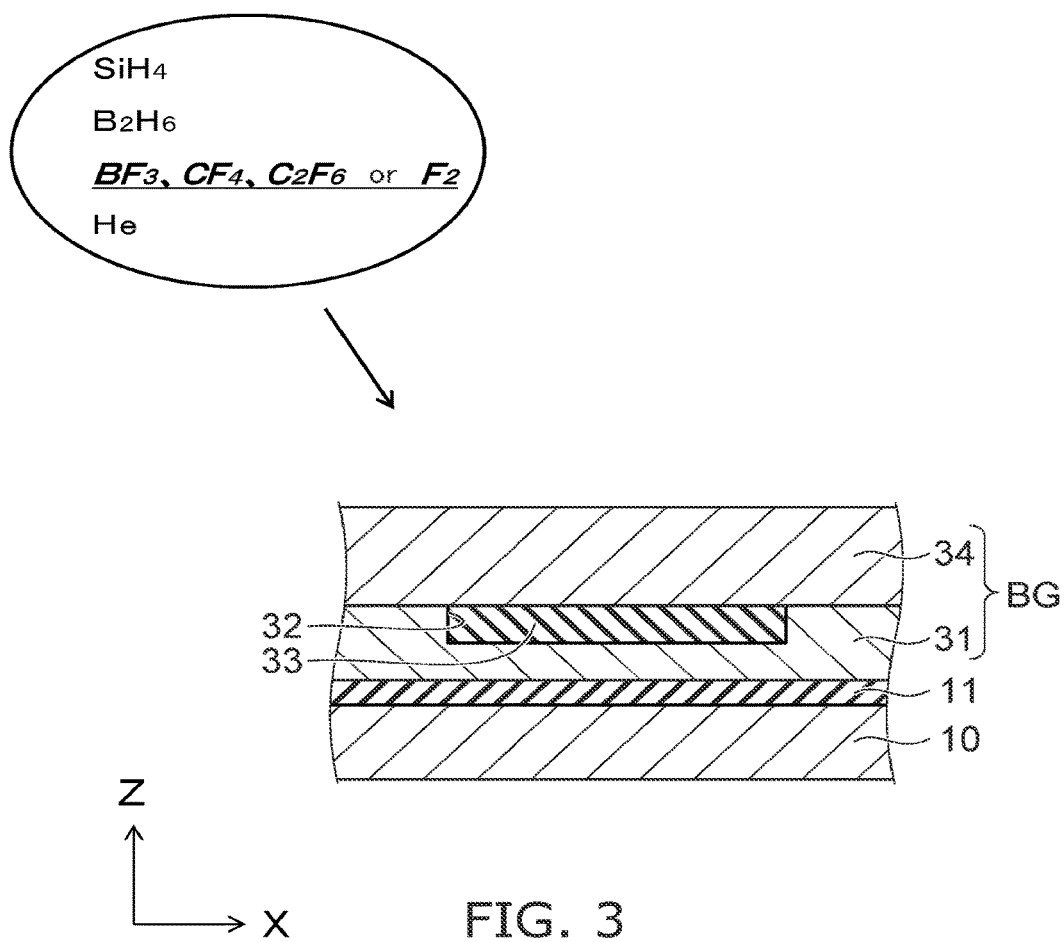
FIGS. 3 to 8 are sectional views illustrating a method for manufacturing a semiconductor device according to the first embodiment.

First, as shown in FIG. 3, an insulating film 11 made of silicon oxide is formed on a silicon substrate 10. A polysilicon film 31 is formed on the insulating film 11. Next, recesses 32 are formed in a matrix pattern in the upper surface of the polysilicon film 31. The longitudinal direction of the recess 32 is directed in the X-direction. The recess 32 is shaped like a generally rectangular solid. Next, a sacrificial material 33 made of e.g. silicon nitride is embedded in the recess 32.

Next, by plasma CVD (chemical vapor deposition), amorphous silicon is deposited while introducing boron and fluorine. The condition at this time is shown in TABLE 1. Thus, a polysilicon film 34 is formed. A back gate electrode film BG is formed from the polysilicon film 31 and the polysilicon film 34. The "HF power" described in TABLE 1 refers to the power of the radio frequency electromagnetic wave having a frequency of 13.56 MHz used for excitation of plasma.

TABLE 1

| Item | Gas species | Optimal range |
|---|---|---|
| Film formation temperature | — | 550° C. |
| Chamber pressure | — | 5-15 torr, e.g., 10 torr |
| HF power | — | 100~500 W, e.g., 200 W |
| Silicon source gas flow rate | SiH$_4$ | 200-600 mL/min, e.g., 500 mL/min |
| Boron source gas flow rate | B$_2$H$_6$ | 50~500 mL/min |
| Fluorine source gas flow rate | BF$_3$, CF$_4$, C$_2$F$_6$ or F$_2$ | 50~500 mL/min |
| Carrier gas flow rate | He | 1~10 L/min, e.g., 5 L/min |

Figure 4:
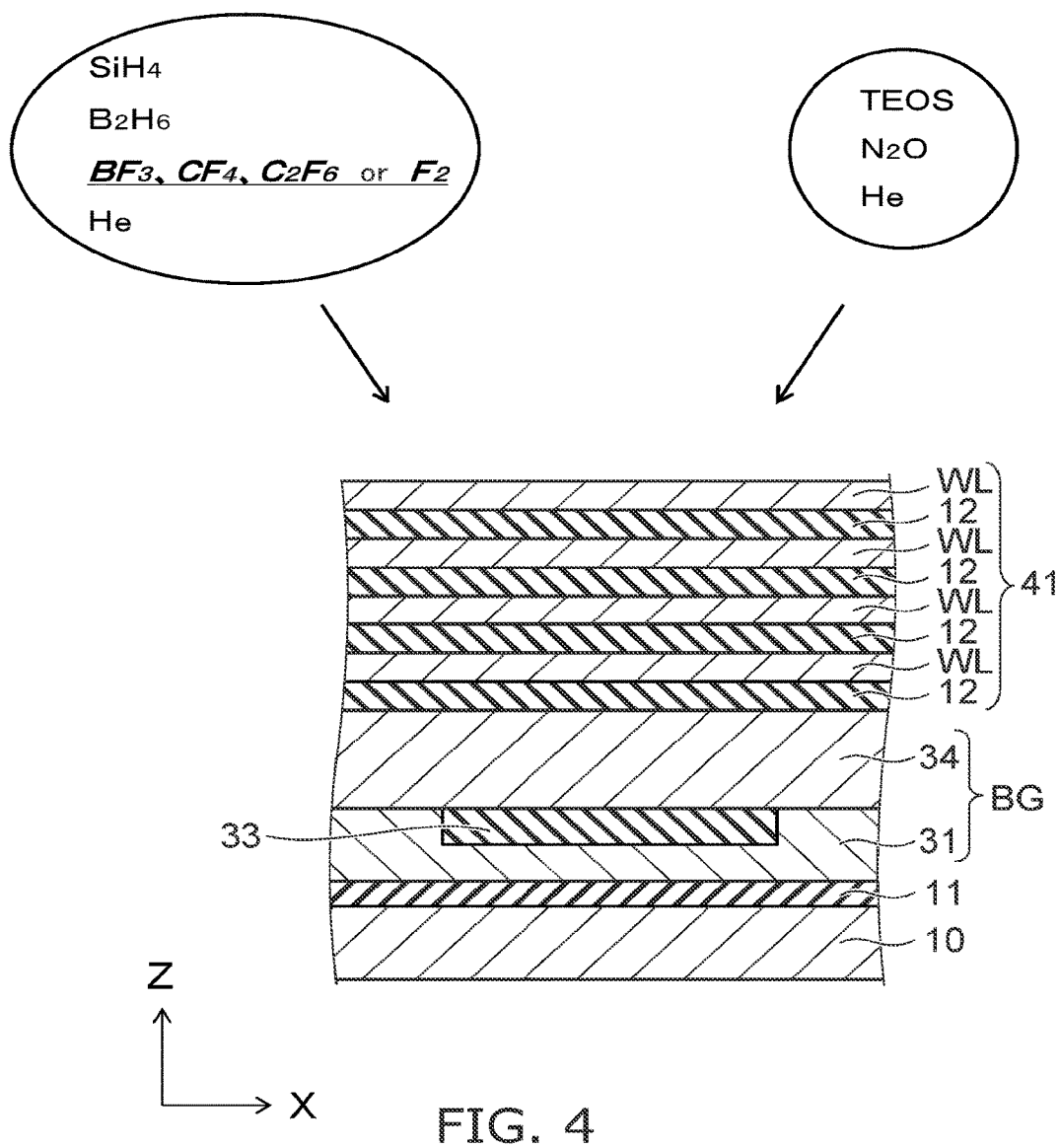

Next, as shown in FIG. 4, silicon oxide and amorphous silicon doped with boron and fluorine are alternately deposited by plasma CVD. Thus, a lower multilayer body 41 is formed on the back gate electrode film BG. The lower multilayer body 41 includes interlayer insulating films 12 and control gate electrode films WL alternately stacked therein. The control gate electrode film WL of the lower multilayer body 41 contains carbon besides boron. The deposition condition of silicon oxide is shown in TABLE 2. The deposition condition of amorphous silicon doped with boron and fluorine is as shown in the above TABLE 1.

TABLE 2

| Item | Gas species | Optimal range |
|---|---|---|
| Film formation temperature | — | 550° C. |
| Chamber pressure | — | 1-10 torr, e.g., 5 torr |
| HF power | — | 100~500 W, e.g., 300 W |
| Silicon oxide source gas | TEOS | 1~5 g/min, e.g., 2 g/min |
| flow rate | N$_2$O | 5~20 L/min, e.g., 15 L/min |
| Carrier gas flow rate | He | 10~20 L/min, e.g., 10 L/min |

Figure 5:
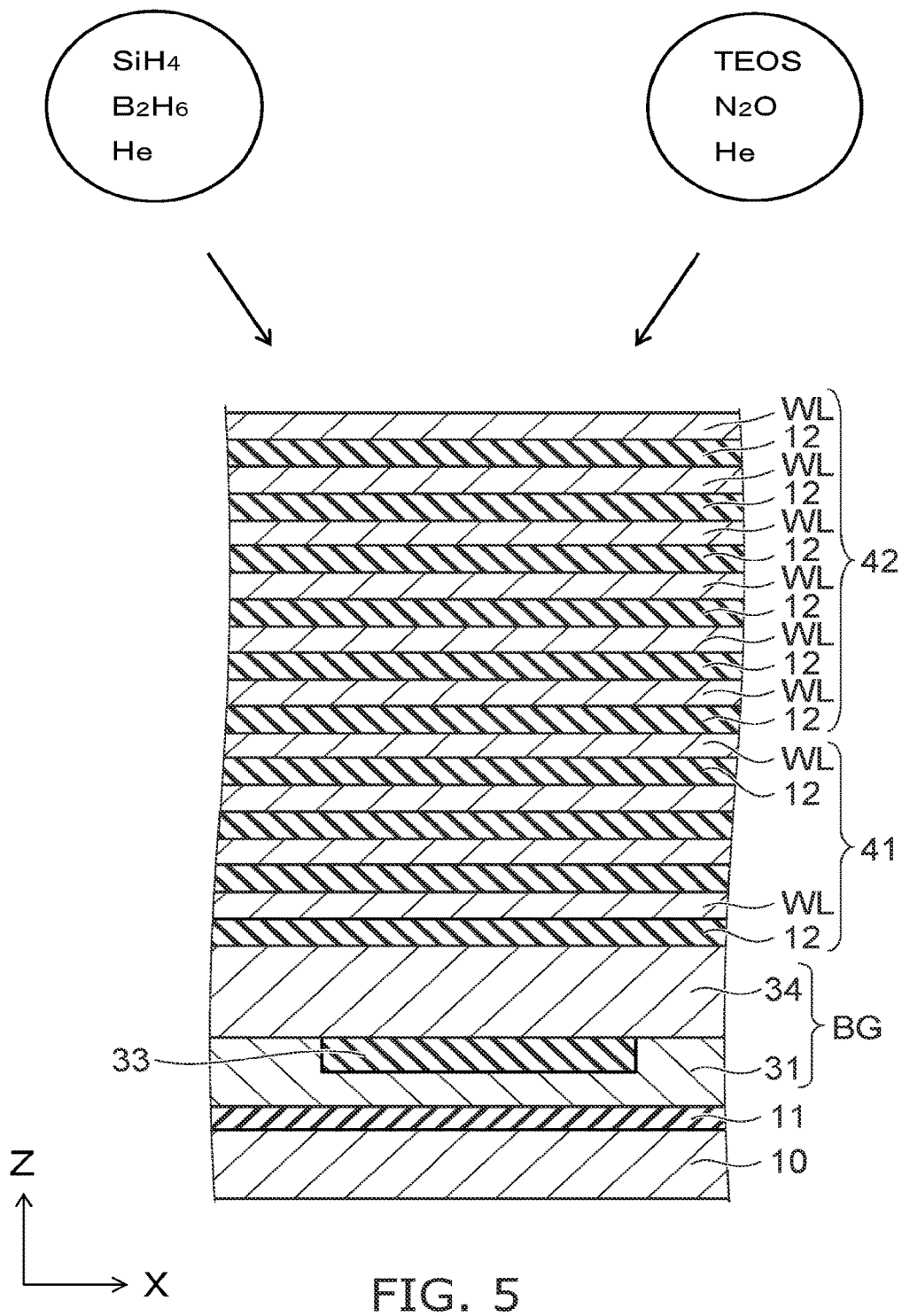

Next, as shown in FIG. 5, amorphous silicon doped with boron, and silicon oxide are alternately deposited by plasma CVD. Thus, a middle multilayer body 42 is formed on the lower multilayer body 41. The middle multilayer body 42 includes control gate electrode films WL and interlayer insulating films 12 alternately stacked therein. The control gate electrode film WL of the middle multilayer body 42 is doped with boron, but not doped with fluorine. The film formation condition of the control gate electrode film WL is as shown in TABLE 3. That is, this condition excludes supply of fluorine source gas from the condition shown in the above TABLE 1. The film formation condition of the interlayer insulating film 12 is as shown in the above TABLE 2.

TABLE 3

| Item | Gas species | Optimal range |
|---|---|---|
| Film formation temperature | — | 550° C. |
| Chamber pressure | — | 5-15 torr, e.g., 10 torr |
| HF power | — | 100~500 W, e.g., 200 W |
| Silicon source | SiH$_4$ | 200-600 mL/min, |

TABLE 3-continued

| Item | Gas species | Optimal range |
| --- | --- | --- |
| gas flow rate | | e.g., 500 mL/min |
| Boron source gas flow rate | $B_2H_6$ | 50~500 mL/min |
| Carrier gas flow rate | He | 1~10 L/min, e.g., 5 L/min |

Figure 6:
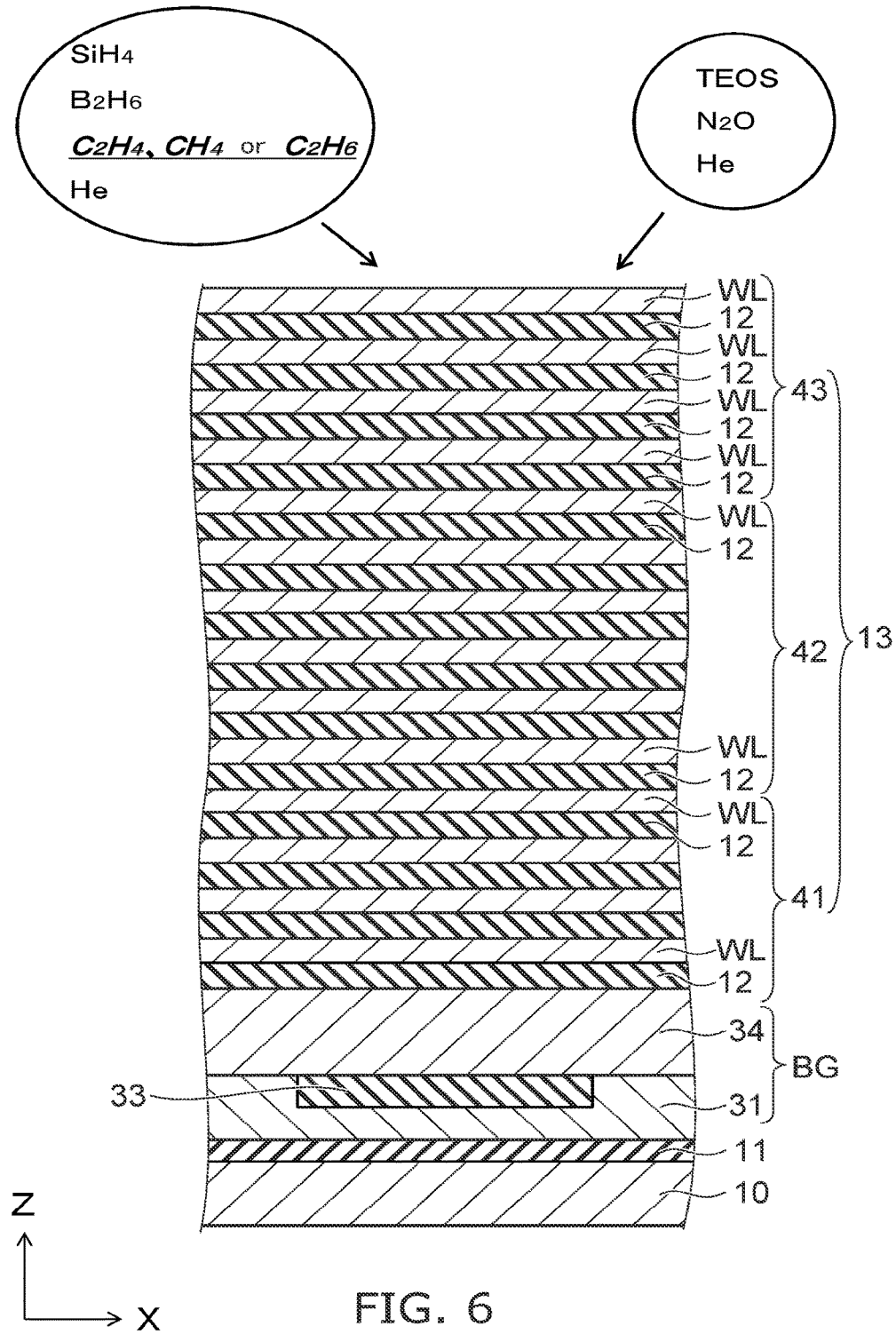

Next, as shown in FIG. 6, amorphous silicon doped with boron and carbon, and silicon oxide are alternately deposited by plasma CVD. Thus, an upper multilayer body 43 is formed on the middle multilayer body 42. The upper multilayer body 43 includes control gate electrode films WL and interlayer insulating films 12 alternately stacked therein. The control gate electrode film WL of the upper multilayer body 43 is doped with boron and carbon. The film formation condition of the control gate electrode film WL is as shown in TABLE 4. That is, this condition adds supply of carbon source gas to the condition shown in the above TABLE 3. The film formation condition of the interlayer insulating film 12 is as shown in the above TABLE 2.

TABLE 4

| Item | Gas species | Optimal range |
| --- | --- | --- |
| Film formation temperature | — | 550° C. |
| Chamber pressure | — | 5-15 torr, e.g., 10 torr |
| HF power | — | 100~500 W, e.g., 200 W |
| Silicon source gas flow rate | $SiH_4$ | 200-600 mL/min, e.g., 500 mL/min |
| Boron source gas flow rate | $B_2H_6$ | 50~500 mL/min |
| Carbon source gas flow rate | $C_2H_4$, $CH_4$, or $C_2H_6$ | 50~500 mL/min |
| Carrier gas flow rate | He | 1~10 L/min, e.g., 5 L/min |

The lower multilayer body 41, the middle multilayer body 42, and the upper multilayer body 43 constitute a multilayer body 13. For instance, in the multilayer body 13, the lower multilayer body 41 accounts for 15-25% of the total number of stages from the bottom. The upper multilayer body 43 accounts for 15-25% of the total number of stages from the top. The middle multilayer body 42 is a portion accounting for 50-70% of the total number of stages except the lower multilayer body 41 and the upper multilayer body 43.

Figure 7:
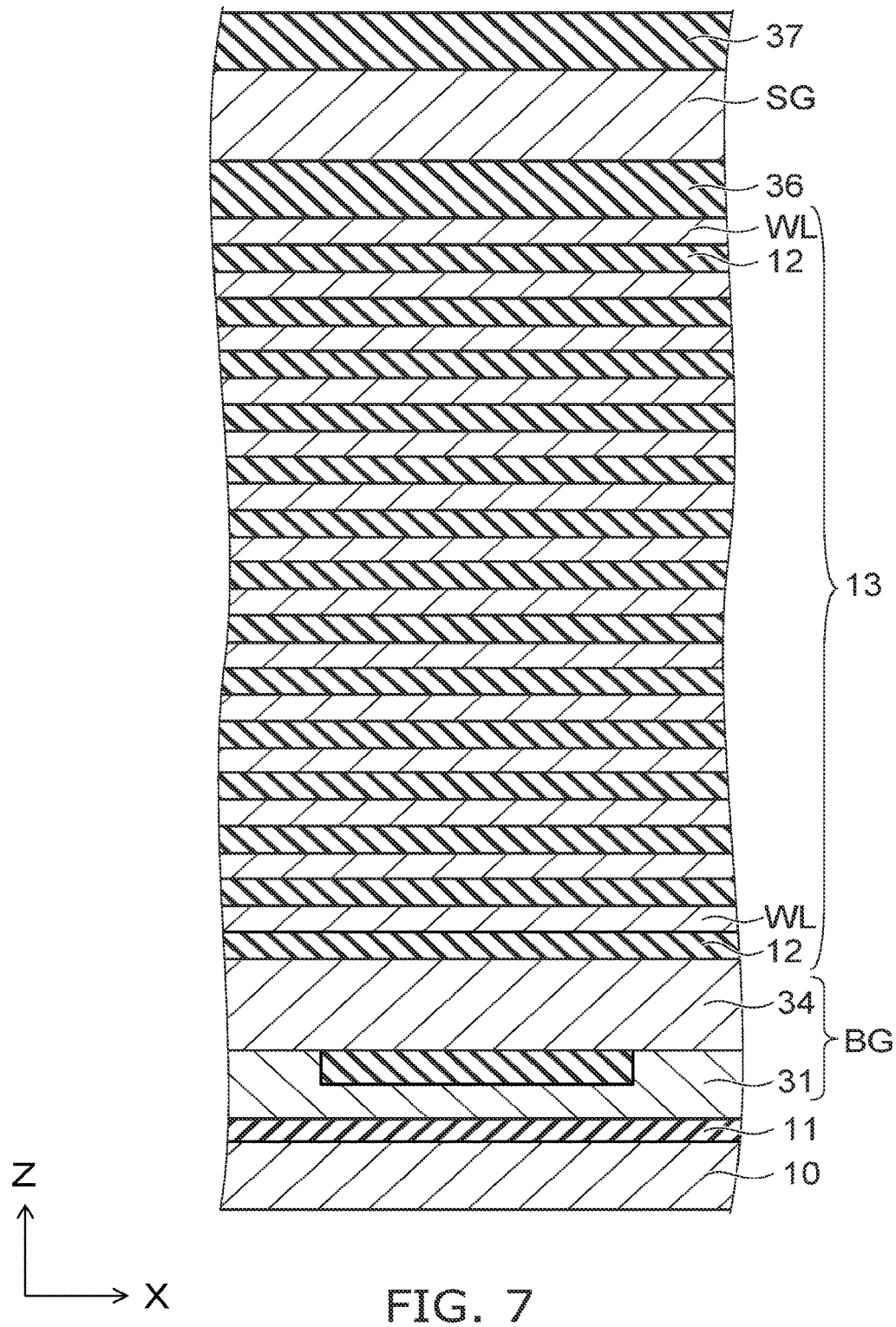

Next, as shown in FIG. 7, an interlayer insulating film 36 made of silicon oxide is formed on the multilayer body 13 by plasma CVD. Next, a select gate electrode SG made of boron-doped polysilicon is formed. Next, an interlayer insulating film 37 made of silicon oxide is formed by plasma CVD. The film formation condition of the interlayer insulating films 36 and 37 is as shown in the above TABLE 2. The select gate electrode SG may or may not be doped with carbon. In the case of doping carbon, the film formation condition of the select gate electrode SG is as shown in the above TABLE 4. In the case of not doping carbon, the film formation condition of the select gate electrode SG is as shown in the above TABLE 3.

Figure 8:
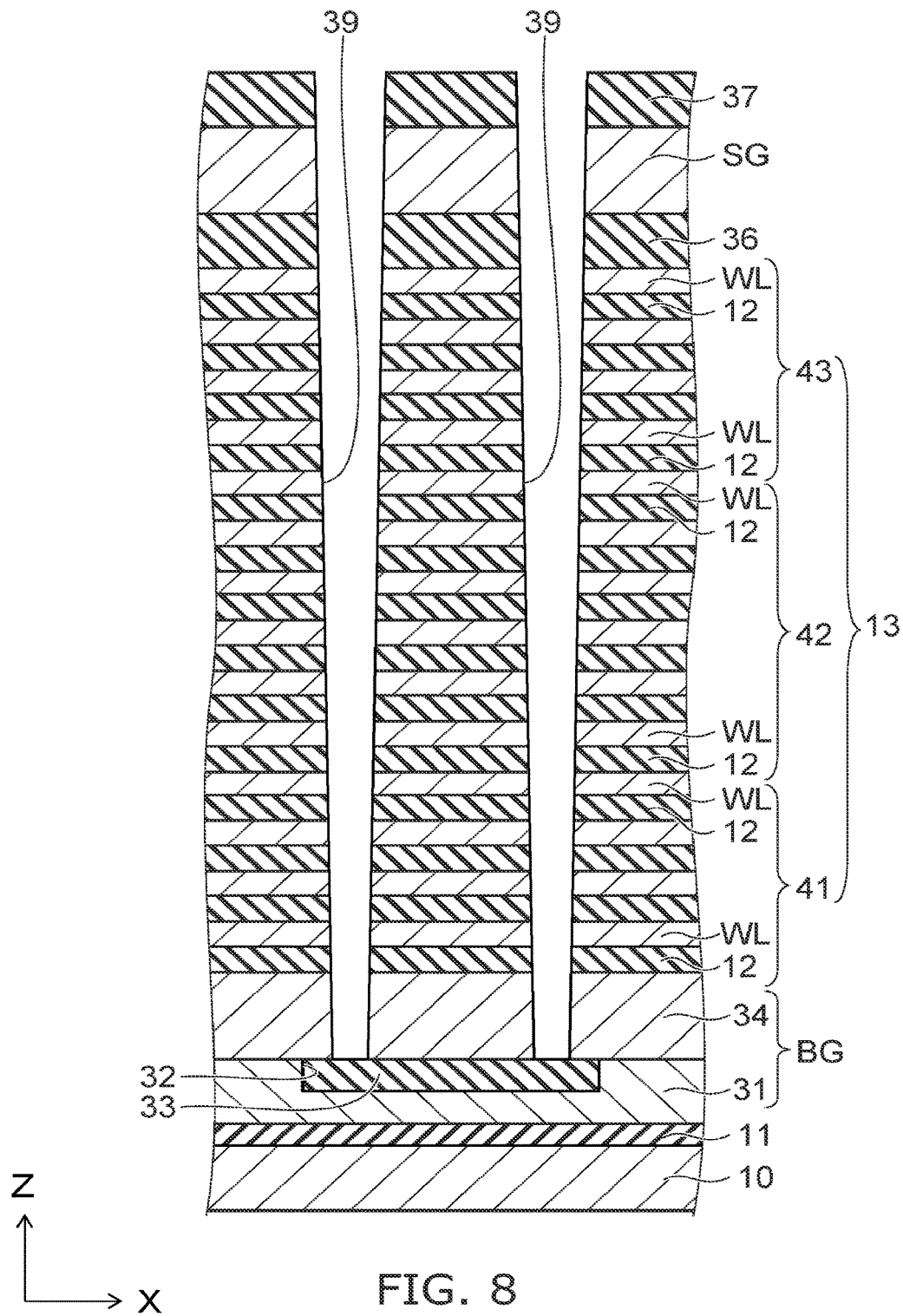

Next, as shown in FIG. 8, by RIE (reactive ion etching), holes 39 extending in the Z-direction are formed in the interlayer insulating film 37, the select gate electrode SG, the interlayer insulating film 36, the multilayer body 13, and the polysilicon film 34. The holes 39 are formed in a matrix pattern at positions such as to reach both X-direction end parts of the recess 32.

In the process of forming the hole 39, during processing the upper multilayer body 43, carbon contained in the control gate electrode film WL is supplied into the hole 39. Thus, carbon improves the depositability of the inner surface of the hole 39 to form a thick protective film. This prevents excessive etching of the inner surface of the hole 39. As a result, a bowing shape is made less likely to occur. On the other hand, during processing the lower multilayer body 41 and the polysilicon film 34, fluorine contained in the control gate electrode film WL is supplied into the hole 39. Thus, the control gate electrode film WL and the interlayer insulating film 12 are etched more easily. This can suppress narrowing of the lower part of the hole 39.

Next, wet etching is performed through the hole 39 to remove the sacrificial material 33 from inside the recess 32. Thus, the hole 39 communicates with the recess 32.

Next, as shown in FIG. 2, a block insulating film 23 is formed on the side surface of the hole 39 and the inner surface of the recess 32. The block insulating film 23 includes e.g. a silicon oxide layer, a high dielectric layer, and a silicon oxide layer stacked in this order. Next, a charge accumulation film 22 is formed by depositing e.g. silicon nitride on the side surface of the block insulating film 23. Next, a tunnel insulating film 21 is formed by forming a silicon oxide layer, a silicon nitride layer, and a silicon oxide layer in this order on the side surface of the charge accumulation film 22. Thus, a memory film 15 is formed on the inner surface of the hole 39 and the recess 32.

Next, as shown in FIGS. 1 and 2, amorphous silicon is deposited on the side surface of the tunnel insulating film 21. Thus, a silicon pillar SP is formed like a circular cylinder in the hole 39, and a pipe connector PC is formed like a rectangular cylinder in the recess 32. Next, an insulating member 17 is formed by embedding e.g. silicon oxide in the space enclosed with the silicon pillar SP. Next, a slit 19 extending in the Y-direction is formed in the interlayer insulating film 37, the select gate electrode SG, the interlayer insulating film 36, and the multilayer body 13 by e.g. lithography technique and RIE. The slit 19 is formed so as to pass between the holes 39 adjacent in the X-direction.

Next, a metal is deposited on the inner surface of the slit 19 and subjected to heat treatment. Thus, the deposited metal is reacted with polysilicon contained in the control gate electrode film WL. Subsequently, the unreacted metal is removed. Thus, salicide treatment is performed on a portion of the control gate electrode film WL to form a silicide portion 26. At this time, the unreacted portion of the control gate electrode film WL constitutes a polysilicon portion 25. Next, an insulating member 18 is formed by embedding e.g. silicon oxide in the slit 19. Next, an upper structure including source lines SL and bit lines BL is formed by the normal method. Thus, the semiconductor device 1 according to this embodiment is manufactured.

Next, the effect of this embodiment is described.

In the semiconductor device 1, the degree of integration of memory cells is effectively improved by increasing the number of stacked layers of the control gate electrode films WL. However, this increases the aspect ratio of the hole 39 and makes its formation difficult. Specifically, if the aspect ratio of the hole 39 is increased, the upper part of the hole 39 is more likely to have a bowing shape. If the hole 39 has a bowing shape, the hole diameter is locally increased. This causes variation in the characteristics of memory cells. Furthermore, the adjacent holes 39 may be connected to each other. On the other hand, in the lower part of the hole 39, the hole 39 is easily narrowed. If the hole 39 is narrowed, the hole diameter is decreased. This causes variation in the characteristics of memory cells. Furthermore, the hole 39 may be occluded halfway. Thus, the hole 39 fails to be formed to the necessary depth. The bowing shape in the upper part of the hole 39 may be suppressed by thickening the protective film formed on the inner surface of the hole 39. However, this makes the lower part of the hole 39 more likely to narrow.

Thus, in this embodiment, when the multilayer body 13 is formed, the control gate electrode film WL of the lower multilayer body 41 is doped with fluorine, and the control gate electrode film WL of the upper multilayer body 43 is doped with carbon. Accordingly, when the hole 39 is formed in the multilayer body 13, carbon is supplied into the hole 39 in the upper multilayer body 43. This improves the depositability of the inner surface of the hole 39. Thus, the occurrence of the bowing shape can be suppressed. On the other hand, in the lower multilayer body 41, fluorine is supplied into the hole 39 and facilitates etching. Thus, depositability is improved to suppress the occurrence of the bowing shape in the upper part of the hole 39, whereas etching is facilitated to prevent occlusion in the lower part. Accordingly, a hole 39 having a good shape can be formed. This results in improving the yield of the semiconductor device 1 and stabilizing the characteristics of memory cells.

It may be considered to mix the aforementioned carbon and fluorine in the etching gas. However, in this case, carbon and fluorine mixed in the etching gas cannot be efficiently supplied into the hole 39. Furthermore, it is difficult to rapidly replenish carbon and fluorine consumed in the hole 39. In contrast, according to this embodiment, carbon and fluorine are contained in the control gate electrode film WL itself. Thus, carbon and fluorine can be generated at the very site of etching processing and supplied into the etching atmosphere. Accordingly, the aforementioned effect can be reliably achieved.

Furthermore, according to this embodiment, carbon or fluorine is contained in the control gate electrode film WL. Thus, the crystal grain diameter of polysilicon is small. Accordingly, aggregation of silicide is less likely to occur when the control gate electrode film WL is silicidized. This stabilizes the shape of the silicide portion 26. As a result, the electrical resistance of the control gate electrode film WL can be maintained at a low level.

Furthermore, in the polysilicon portion 25 of the control gate electrode film WL, carbon contained therein forms a compound with boron. This can suppress diffusion of boron. As a result, the boron concentration in the polysilicon portion 25 can be maintained. This can suppress formation of a depletion layer.

Second Embodiment

Next, a second embodiment is described.

This embodiment is different from the above first embodiment in the method of introducing impurity. More specifically, in the above first embodiment, carbon and fluorine are introduced as a source gas of CVD. In this embodiment, carbon and fluorine are introduced by ion implantation.

The configuration of the semiconductor device according to this embodiment is similar to the configuration shown in FIGS. 1 and 2. However, in this embodiment, the interlayer insulating film 12 of the lower multilayer body 41 is also doped with fluorine. The interlayer insulating film 12 of the upper multilayer body 43 is also doped with carbon. Thus, in the multilayer body 13, the carbon concentration of the interlayer insulating film 12 constituting the upper multilayer body 43 is higher than the carbon concentration of the interlayer insulating film 12 constituting the middle multilayer body 42 and the lower multilayer body 41. The fluorine concentration of the interlayer insulating film 12 constituting the lower multilayer body 41 is higher than the fluorine concentration of the interlayer insulating film 12 constituting the middle multilayer body 42 and the upper multilayer body 43. For instance, the carbon concentration of the interlayer insulating film 12 of the uppermost stage is higher than the carbon concentration of the interlayer insulating film 12 of the lowermost stage. The fluorine concentration of the interlayer insulating film 12 of the lowermost stage is higher than the fluorine concentration of the interlayer insulating film 12 of the uppermost stage. With regard to the control gate electrode film WL, as in the above first embodiment, the control gate electrode film WL of the lower multilayer body 41 is doped with fluorine. The control gate electrode film WL of the upper multilayer body 43 is doped with carbon.

Next, a method for manufacturing a semiconductor device according to this embodiment is described.

Figure 9:
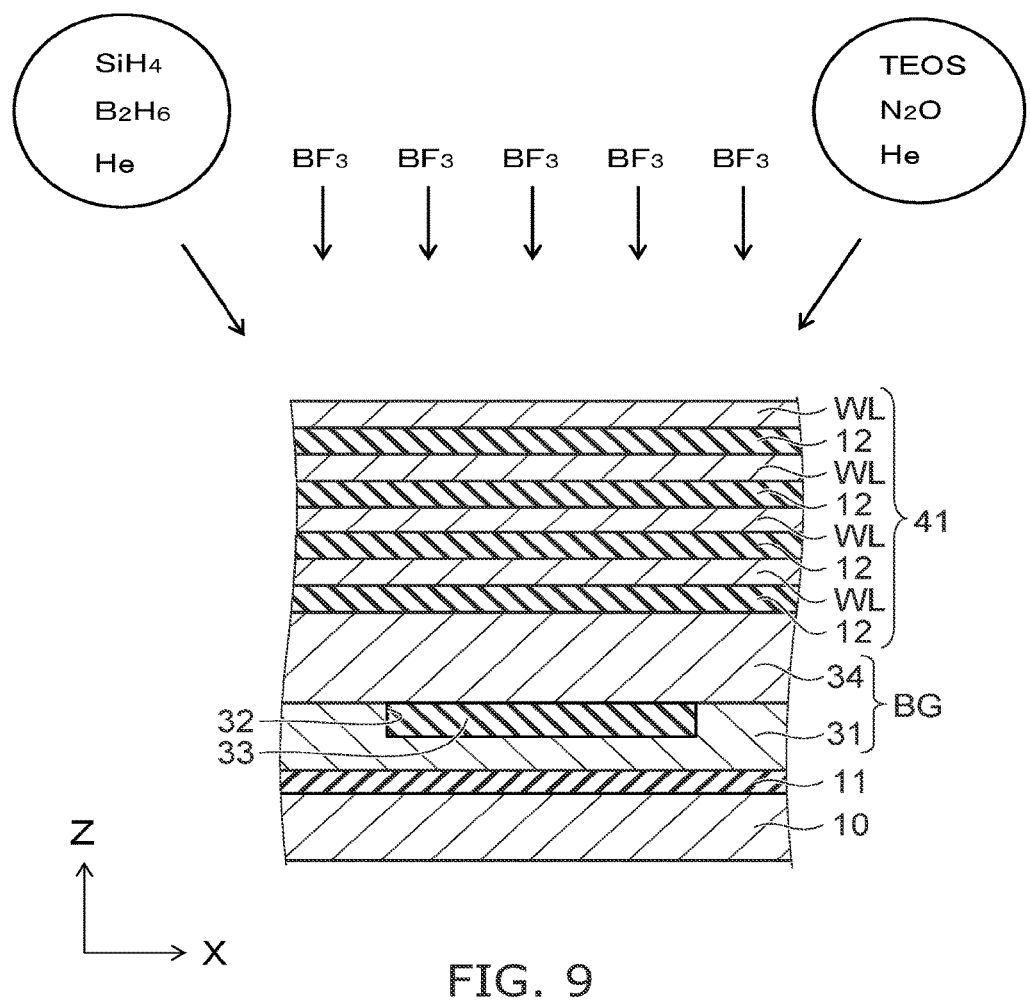
FIGS. 9 to 11 are sectional views illustrating a method for manufacturing a semiconductor device according to a second embodiment.
Figure 10:
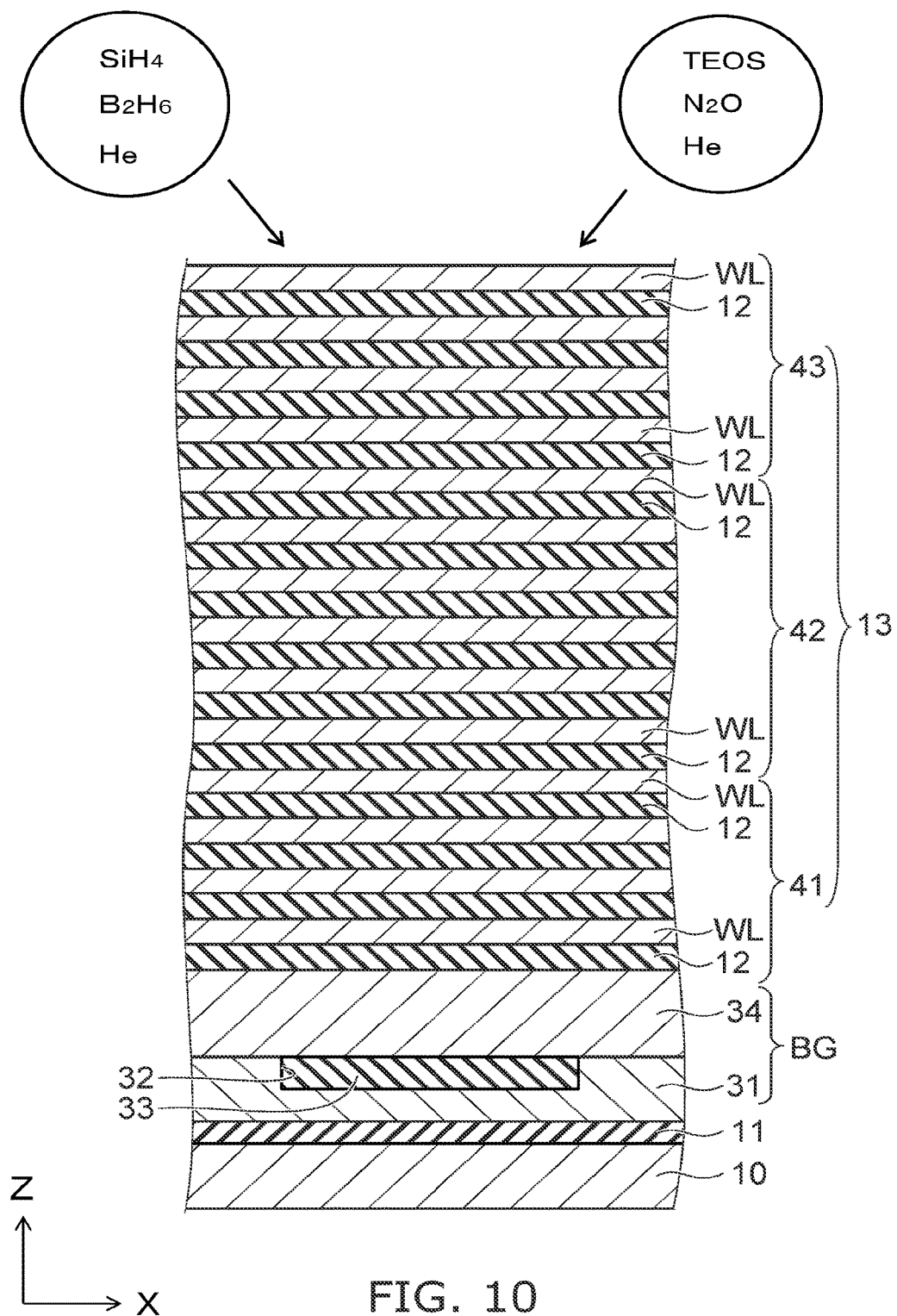
Figure 11:
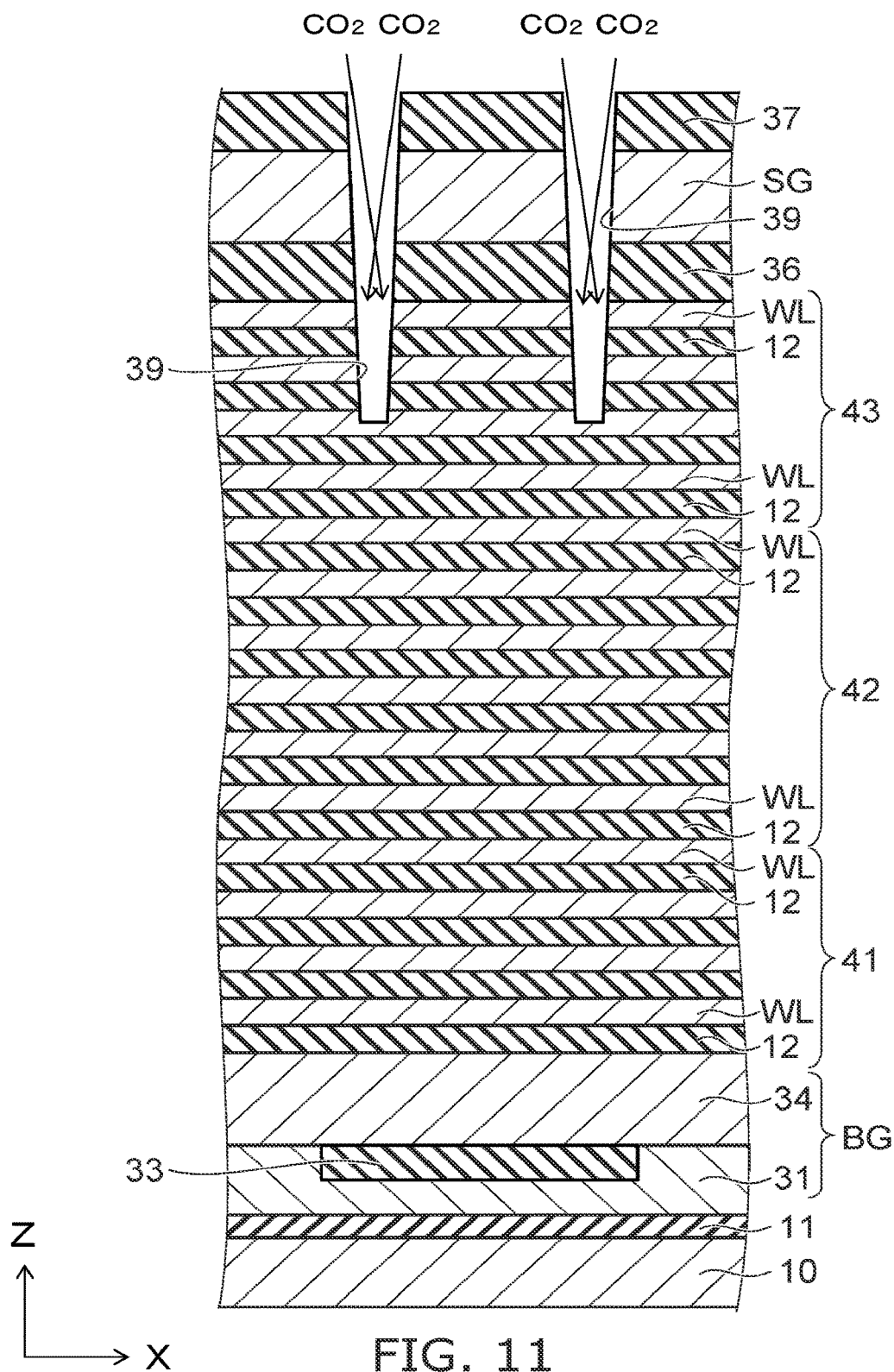

FIGS. 9 to 11 are sectional views illustrating a method for manufacturing a semiconductor device according to this embodiment.

First, as shown in FIG. 9, an insulating film 11, a polysilicon film 31, a sacrificial material 33, and a polysilicon film 34 are formed on a silicon substrate 10. Next, a lower multilayer body 41 is formed by alternately forming interlayer insulating films 12 and electrode films WL.

When the polysilicon film 34 and the control gate electrode film WL are formed, CVD is performed under the condition shown in the above TABLE 3. More specifically, the fluorine source gas is not supplied. Only the silicon source gas ($SiH_4$) and the boron source gas ($B_2H_6$) are supplied with the carrier gas (He). However, $BF_3$ is ion-implanted simultaneously with film formation by CVD. Thus, the polysilicon film 34 and the control gate electrode film WL of the lower multilayer body are doped with fluorine. At this time, the interlayer insulating film 12 of the lower multilayer body 41 is also doped with fluorine. On the other hand, when the interlayer insulating film 12 is formed, CVD is performed under the condition shown in the above TABLE 2 as in the above first embodiment.

Next, as shown in FIG. 5, a middle multilayer body 42 is formed on the lower multilayer body 41. The film formation condition at this time is similar to that of the above first embodiment. That is, the control gate electrode film WL is formed under the condition shown in the above TABLE 3. The interlayer insulating film 12 is formed under the condition shown in the above TABLE 2.

Next, as shown in FIG. 10, an upper multilayer body 43 is formed on the middle multilayer body 42. At this time, the control gate electrode film WL is formed under the condition shown in the above TABLE 3. More specifically, the carbon source gas is not supplied. Only the silicon source gas ($SiH_4$) and the boron source gas ($B_2H_6$) are supplied with the carrier gas (He). The interlayer insulating film 12 is formed under the condition shown in the above TABLE 2.

Next, as shown in FIG. 7, an interlayer insulating film 36, a select gate electrode SG, and an interlayer insulating film 37 are formed.

Next, as shown in FIG. 11, a hole 39 is formed in the interlayer insulating film 37, the select gate electrode SG, and the interlayer insulating film 36 by performing RIE thereon. Next, a hole 39 is formed in the upper multilayer body 43 by performing RIE thereon. At this time, $CO_2$ is ion-implanted simultaneously with RIE. Thus, carbon is introduced near the hole 39 in the control gate electrode film WL and the interlayer insulating film 12 through the inner surface of the hole 39. Accordingly, when the upper multilayer body 43 is etched, carbon is supplied into the etching atmosphere and improves depositability.

Next, as shown in FIG. 8, a hole 39 reaching the sacrificial material 33 is formed by performing RIE on the middle multilayer body 42, the lower multilayer body 41, and the polysilicon film 34. When the lower multilayer body 41 is processed, carbon introduced into the control gate electrode film WL and the interlayer insulating film 12 of the lower multilayer body 41 in the step shown in FIG. 9 is supplied into the hole 39 and facilitates etching. The subsequent process is similar to that of the above first embodiment.

Next, the effect of this embodiment is described.

Also in this embodiment, as in the above first embodiment, when a hole 39 is formed in the upper multilayer body 43, carbon is supplied into the hole 39. This improves depositability, and the occurrence of a bowing shape can be suppressed. When a hole 39 is formed in the lower multilayer body 41, fluorine is supplied into the hole 39. This facilitates etching and suppresses occlusion of the hole 39. Thus, a hole 39 having a good shape can be formed.

Furthermore, in this embodiment, the interlayer insulating film 12 made of silicon oxide is doped with carbon and fluorine. Thus, the permittivity of the interlayer insulating film 12 is decreased. This can suppress interference between the adjacent memory cells.

The configuration, operation, and effect of this embodiment other than the foregoing are similar to those of the above first embodiment.

In the example described in the above embodiments, fluorine is introduced into the lower portion of the multilayer body 13, and carbon is introduced into the upper portion. However, it is also possible to perform only one of the introduction of fluorine into the lower portion and the introduction of carbon into the upper portion. This also achieves the effect of improving the shape of the hole 39. Furthermore, introduction of fluorine or carbon by CVD and introduction of fluorine or carbon by ion implantation may be performed in combination. For instance, fluorine may be introduced by CVD, and carbon may be introduced by ion implantation. Alternatively, fluorine may be introduced by ion implantation, and carbon may be introduced by CVD. Alternatively, fluorine and carbon may be introduced by CVD and ion implantation used in combination.

Furthermore, in the example described in the above embodiments, carbon is uniformly introduced into the control gate electrode film WL located in the upper portion of the multilayer body 13, and fluorine is uniformly introduced into the control gate electrode film WL located in the lower portion of the multilayer body 13. However, the embodiment is not limited thereto. It is also possible to control whether to introduce carbon, to introduce fluorine, or not to introduce carbon or fluorine, for each control gate electrode film WL. Moreover, in the example described in the above embodiments, the upper multilayer body 43 doped with carbon accounts for 15-25% of the total number of stages from the top of the multilayer body 13, and the lower multilayer body 41 doped with fluorine accounts for 15-25% of the total number of stages from the bottom of the multilayer body 13. However, the embodiment is not limited thereto. The upper multilayer body 43 only needs to be located above the lower multilayer body 41. The number of stages of the upper multilayer body 43 and the lower multilayer body 41 is arbitrary.

Moreover, in the example described in the above embodiments, the lower end part of the silicon pillar SP connected to the bit line BL is connected through the pipe connector PC to the lower end part of the silicon pillar SP connected to the source line SL. However, the configuration of the semiconductor device is not limited thereto. For instance, a source line may be placed between the silicon substrate 10 and the multilayer body 13. The upper end part of each silicon pillar SP may be connected to the bit line. The lower end part of each silicon pillar SP may be connected to the source line.

The embodiments described above can realize a semiconductor device having high reliability and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device comprising:
   a substrate;
   a multilayer body provided on the substrate, the multilayer body including electrode films and insulating films, the electrode films containing silicon, the insulating films containing silicon oxide, each of the electrode films and each of the insulating films being alternately stacked; and
   a semiconductor member provided in the multilayer body, and the semiconductor member vertically extending in the multilayer body,
   the electrode films including:
      a first electrode film; and
      a second electrode film located below the first electrode film,
   a first memory cell being formed between the semiconductor member and the first electrode film,
   a second memory cell being formed between the semiconductor member and the second electrode film,
   carbon concentration of the first electrode film being higher than carbon concentration of the second electrode film,
   the insulating films including:
      a first insulating film; and
      a second insulating film located below the first insulating film, and
   carbon concentration of the first insulating film being higher than carbon concentration of the second insulating film.

2. A semiconductor device comprising:
   a substrate;
   a multilayer body provided on the substrate, the multilayer body including electrode films and insulating films, the electrode films containing silicon, the insulating films containing silicon oxide, each of the electrode films and each of the insulating films being alternately stacked; and
   a semiconductor member provided in the multilayer body, and the semiconductor member vertically extending in the multilayer body,
   the electrode films including:
      a first electrode film; and
      a second electrode film located below the first electrode film, a first memory cell being formed between the semiconductor member and the first electrode film, a second memory cell being formed between the semiconductor member and the second electrode film, carbon concentration of the first electrode film being higher than carbon concentration of the second electrode film, the insulating films including:
   a first insulating film; and
   a second insulating film located below the first insulating film, and fluorine concentration of the second insulating film being higher than fluorine concentration of the first insulating film.

* * * * *